(12) United States Patent
Meiling et al.

(10) Patent No.: US 6,750,474 B1
(45) Date of Patent: Jun. 15, 2004

(54) SEMICONDUCTING DEVICES AND METHOD OF MAKING THEREOF

(75) Inventors: Hans Meiling, Bilthoven (NL); Rudolf Emmanuel Isidor Schropp, Driebergen-Rijsenburg (NL)

(73) Assignee: Debye Instituut. Universiteit Ultrecht, Ultrecht (NL)

( * ) Notice: Subject to any disclaimer, the term of this patent is extended or adjusted under 35 U.S.C. 154(b) by 241 days.

(21) Appl. No.: 09/852,999

(22) Filed: May 10, 2001

Related U.S. Application Data

(62) Division of application No. 09/331,528, filed as application No. PCT/EP97/07195 on Dec. 18, 1997, now Pat. No. 6,686,230.

(30) Foreign Application Priority Data

Dec. 23, 1996 (NL) .............................................. 1004886

(51) Int. Cl.$^7$ .................. H01L 29/04; H01L 31/036; H01L 31/0376; H01L 31/20
(52) U.S. Cl. ............................ 257/57; 257/66; 257/68; 257/71; 438/149; 438/151; 438/157
(58) Field of Search ..................... 257/57, 66; 438/149, 438/151, 157

(56) References Cited

U.S. PATENT DOCUMENTS

| | | |
|---|---|---|
| 4,237,151 A | 12/1980 | Strongin et al. |
| 4,465,706 A | 8/1984 | Dalal et al. |
| 4,485,128 A | 11/1984 | Dalal et al. |
| 4,589,006 A * | 5/1986 | Hansen et al. .............. 257/430 |
| 4,634,605 A | 1/1987 | Wiesmann |
| 4,747,077 A | 5/1988 | Hockley et al. |
| 5,281,546 A | 1/1994 | Possin et al. |
| 5,397,737 A | 3/1995 | Mahan et al. |
| 5,500,047 A | 3/1996 | Park et al. |
| 5,634,605 A * | 6/1997 | Rubel et al. ............. 248/228.1 |
| 5,776,819 A * | 7/1998 | Mahan et al. ............... 438/482 |
| 5,798,137 A | 8/1998 | Lord et al. |

FOREIGN PATENT DOCUMENTS

| | | |
|---|---|---|
| DE | 43 33 416 | 4/1995 |
| EP | 0 687 753 | 12/1995 |

OTHER PUBLICATIONS

H. Meiling et al., Stability of hot–wire deposited amorphous–silicon thin–film transistors, Appl. Phys. Lett. 69(8), Aug. 19, 1996.*

Kikuo Ono et al. , Inverse–Staggered Ploycrystalline Silicon Thin–Film Transisitors Fabricated by Excimer Laser Irradiation, Electronics and Communications in Japan, Part 2, vol. 76, No. 12, 1993 pp. 40–47.*

Welling H. et "Stability of hot–wire deposited amorphous–silicon thin–film transistors", Applied Physics Letters, Aug. 19, 1996, AIP. USA, vol. 69, No. 8, ISSN 0003–6951. pp. 1062–1064. XP000626137.

Kikuo Ono et al., "Inverse–Staggered Polycrystalline Silicon thin Film Transistors Fabricated By Excimer Laser Irradiation", Electronics vol. 76, No. 12, Dec., 1993, pp. 40–46, XP000458568.

Doyle R. et al., "Production of high–quality amorphous silicon films by evaporative silane surface decomposition", Journal of Applied Physics. Sep. 15, 1988, USA, vol. 64. No. 6, ISSN 0021–8979, pp. 3215–3223, XP00097188.

Japanese Abstract of 01–162768, dated Jun. 27, 1989: Araki Nakoto: Formaton of Anorphous Silicon.

* cited by examiner

*Primary Examiner*—Long Pham
*Assistant Examiner*—Shrinivas H. Rao
(74) *Attorney, Agent, or Firm*—Frommer Lawrence & Haug LLP; William S. Frommer; Matthew K. Ryan

(57) ABSTRACT

The invention relates to a process for providing a semiconducting device including the steps of depositing a semiconducting layer onto a substrate by means of heating a gas to a predetermined, disassociation temperature so that the gas dissociates into fractions, whereby these fractions subsequently condense on the substrate to build up a semiconducting layer.

9 Claims, 3 Drawing Sheets

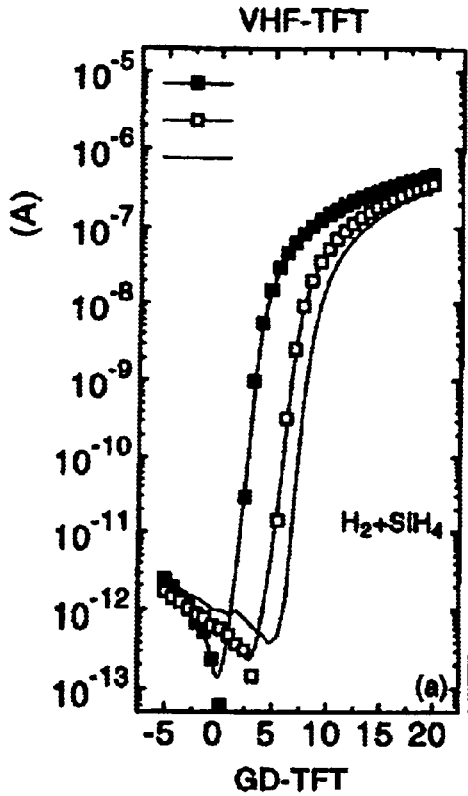
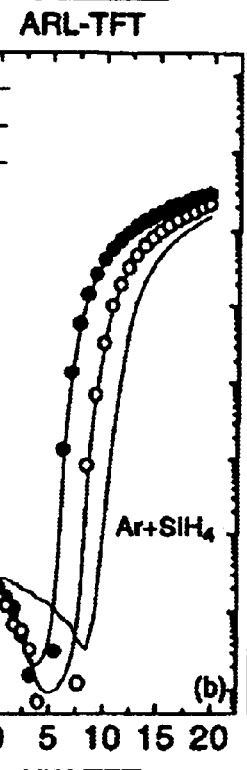
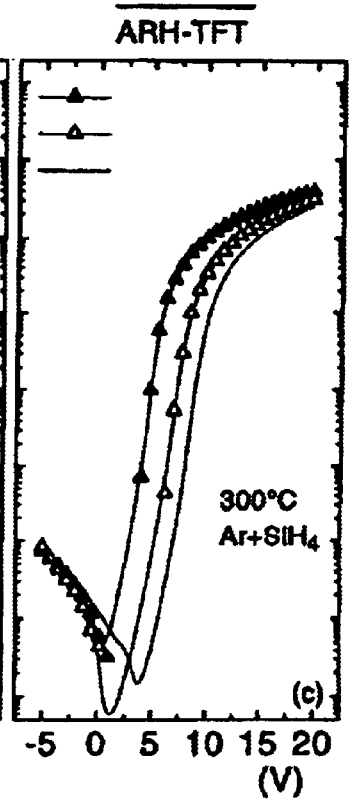
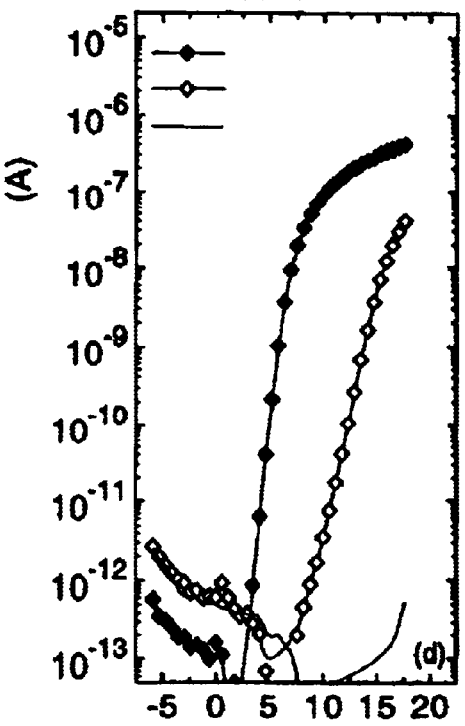
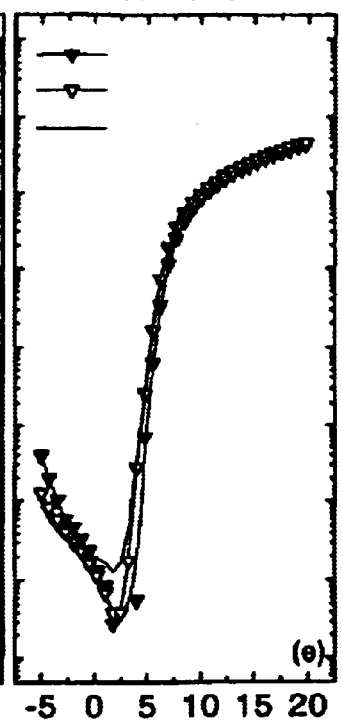

SEMICONDUCTING DEVICES AND METHOD OF MAKING THEREOF

This application is a division of application Ser. No. 09/331,528 Aug. 5, 1999, now U.S. Pat. No. 6,686,280, which is a 371 of PCT/EP97/07195 filed on Dec. 12, 1997.

This invention relates to a moving apparatus provided with a drive wheel driven by human power (strength) and a movement control method for such a moving apparatus, and more particularly to a moving apparatus provided with a driving force assist device using chargeable secondary battery as drive source and adapted to carry out traveling by making use of drive force from the drive force assist device in addition to a human power in dependency upon traveling state, and a movement control method for such a moving apparatus.

Semiconducting devices have a wide variety of applications. For example thin film transistors, TFTs incorporating amorphous silicon or polycrystalline silicon are employed as current switching devices in applications such as the active matrix of liquid crystal displays.

A thin-film transistor 40 (FIG. 3) is in its most simple form a three-terminal device, i.e. it has three separate metal contacts.

An example of the TFT composition is as follows: a flat wafer 42 made of highly doped crystalline silicon is thermally oxidized on one face. The oxide layer 44 is a non-conducting or insulating layer. Alternative materials, including but not limited to silicon nitride or silicon polynitride, can also function as the insulator. On the opposing face of the wafer a metal contact is applied, the gate contact 46. Then a semiconducting material, e.g. poly-crystalline silicon or silicon or hydrogenated amorphous silicon ($\alpha$-Si:H), is applied to the side of the wafer where the insulator is present 48. On top of this semiconducting layer 48 a second silicon layer 50, which contains dopant atoms such as phosphorus or boron, is applied. Then on top of this, two metal contacts for the source 52 and drain 54 are applied adjacent to each other with a set and fixed distance between them. The highly conductive lastly applied silicon layer is removed from between the source and drain contacts, hence creating a semi-insulating path between these contacts.

When a voltage is applied to the gate contact a highly conductive sublayer is created in the semiconductor, parallel to and spatially adjacent to the interface of the insulator and semiconductor. This layer is called the channel of the TFT and is typically 50 Ångstrom to 200 Ångstrom thick. The effect of enhanced conductivity upon application of a voltage to the gate electrode is the field effect. When an electric field is present between the source and drain, current conduction through the TFT takes place from the source to the interface, then laterally along the interface if a voltage is applied to the gate, and out perpendicular to the said interface through the drain.

In thin-film transistors based on hydrogenated amorphous silicon, a shift to higher voltages at the onset of current conduction (the threshold voltage) is commonly observed upon prolonged application of a positive voltage to the gate terminal of the device. Also a deterioration of the subthreshold slope is observed. When a negative voltage is applied, a shift of the threshold voltage is also observed.

Conventional techniques for depositing a semiconducting layer onto a substrate include the so-called radiofrequency glow discharge technique at 13.56 MHz (a form of plasma enhanced chemical vapour deposition) and also at higher excitation frequencies in the range of 13.56 MHz to 150 MHz.

A problem of $\alpha$-Si:H in electronic devices such as solar cells, diodes, and TFTs, is its metastable behavior upon application of a continuous voltage to one of the electrodes or to the gate electrode of TFTs and upon illumination with light.

For example in flat screen televisions comprising an active matrix, where the screens consist of a number of pixels, each pixel has a transistor which can be switched on and off to allow light to pass through, whereby the clarity of the image can be controlled. Transistors incorporating $\alpha$-Si:H as the semiconducting material exhibit an increase in gate threshold voltage to achieve the same current, sometimes after only a half hour.

Furthermore, light illumination of a solar cell causes the creation of electronic defects which results in deteriation of the device performance.

These effects are reversible, for instance when the device is heated to about 150° C., the original device characteristics can be re-obtained. However this heat treatment in neither a practical nor economical solution for the many applications comprising these devices.

In thin film transistors incorporating an $\alpha$-Si:H semiconducting layer, the creation of electronic defects is caused by a continuous voltage applied to the gate contact. A shift in the gate voltage at the onset of current conduction, the so-called threshold voltage, is generally observed, even after only a few minutes of gate voltage application. This means that after several minutes of operation, a higher voltage is required to turn on the transistor, which results in the unwanted effect of drift in the operational characteristics. This effect is illustrated in FIGS. 4 and 7. In FIG. 4 the characteristics, are shown for a TFT with the $\alpha$-Si:H deposited at 50 MHz, in FIG. 7 those for a 13.56 MHz TFT. The curves are for "as deposited", after 1.5 h stress, and after 2.5 h stress, respectively.

An object of the present invention is to provide improved semiconductor devices.

According to a first aspect the present invention provides a process for providing a semiconducting device comprising the steps of:

depositing a semiconducting layer onto a substrate by means of heating a gas to a predetermined, dissociation temperature so that the gas dissociates whereby fractions thereof condense on the substrate to build up a semiconducting layer.

The inventors have found that depositing a semiconducting layer onto a substrate in this manner yields a semiconducting device which exhibits substantially no shift in threshold voltage upon gate voltage application.

According to a further aspect of the present invention there is provided a device, in particular being a transistor, said device having a substantially consistent gate voltage and a saturation mobility $\mu$, in the range of about 0.001 to about 100, for example about 0.001 to about 10 and most preferably from about 0.1 to about 1.00 cm$^2$/V·s.

According to yet another aspect of the present invention, there is provided a device comprising a substantially exclusive polycrystalline Si:H or a polycrystalline and amorphous Si:H layer, said device having a substantially consistent gate voltage and a saturation mobility lying in the range of about 0.001–1000, for example 0.001 to 500 cm$^2$/V·s.

Although exhibiting a similar saturation mobility to TFT's according to the present invention, conventional TFT's still suffer from dramatically increasing threshold voltages during their working lives.

According to another aspect of the present invention, there is provided a semiconducting device obtainable according to the above process.

According to a further aspect of the present invention there is provided a vacuum chamber for carrying out the above process.

The present invention will be further elucidated by way of the following description, specific example and figures, wherein:

FIG. 1 shows a representation of a conventional method for depositing semiconducting layers;

FIG. 2 schematically shows a deposition chamber with the hot filament assembly according to the present invention;

FIGS. 4–7 show graphs of the shift in threshold voltage in time of thin film transistors obtained according to the known method; and FIG. 8 shows a graph of the source drain current versus the gate voltage for a thin film transistor obtained according to the present invention.

Figure 1:
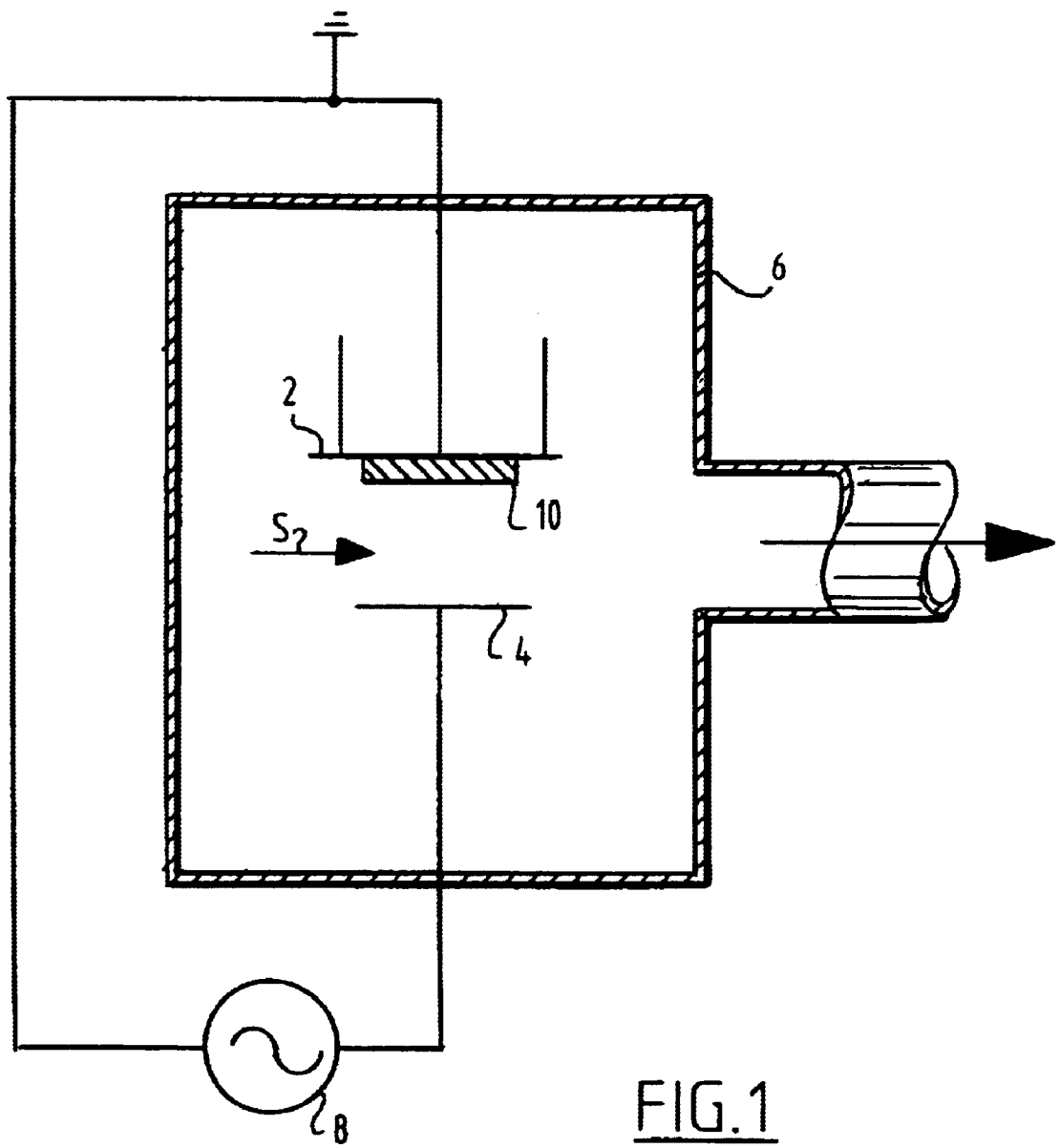

α-Si:H based thin file transistors are usually currently made using the radiofrequency plasma enhanced chemical vapour deposition (PECVD) method, in the following way. Between two metallic plates 2, 4 (FIG. 1) separated typically by 1–5 cm, a silicon containing gas S is dissociated by an alternating electric field. The plates 2, 4 are enclosed in a vacuum vessel 6. The electric field is generated by a radiofrequency generator 8 and the voltage signal typically has a frequency in the range of about 13.56 million to 150 million Hz. The radiofrequency power usually is limited to $\leq 50$ watts depending on the size of the substrate 10. On forming a semiconducting layer on the substrate 10, the silicon containing gas is guided into the vacuum vessel 6, and the radiofrequency is switched on. The substrate is heated to around 220° C., whereby the flow of the silicon containing gas is usually 30 standard cm$^3$/minute (sccm) and wherein a pressure of 0.1 to 0.5 millibar exists in the vessel 6.

FIGS. 4–7 show standard drain current versus gate voltage shift for thin film transistors obtained according to this known method.

| Key to FIGS. 4–7 | |
|---|---|
| -■- | drain current versus gate |
| -●- | voltage, measured at t = 0 |
| -▲- | after start of the gate voltage stress |
| -♦- | |
| -▼- | |
| -□- | drain current versus |
| -○- | gate voltage, at t = 1½ hours |
| -△- | after start of the gate voltage stress |
| -◇- | |
| -▽- | |
| —— | drain current versus |
| | gate voltage at t = 2½ hours |
| | after start of the gate voltage stress |

Figure 2:
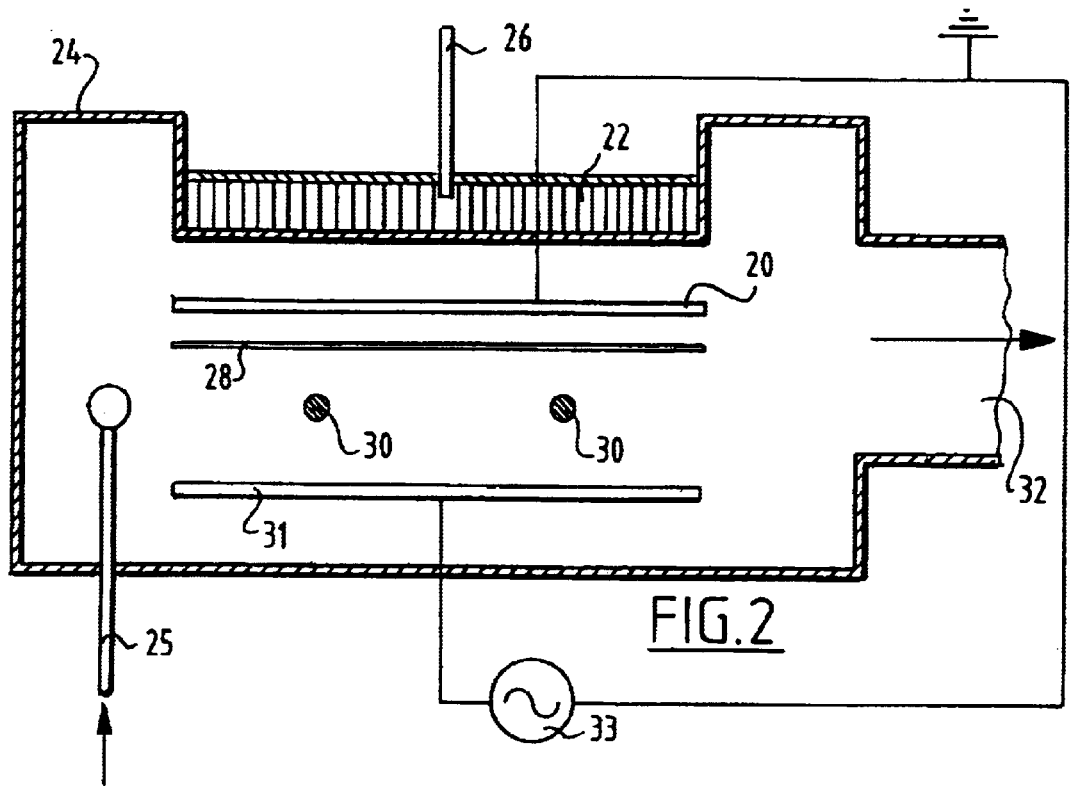
Figure 3:
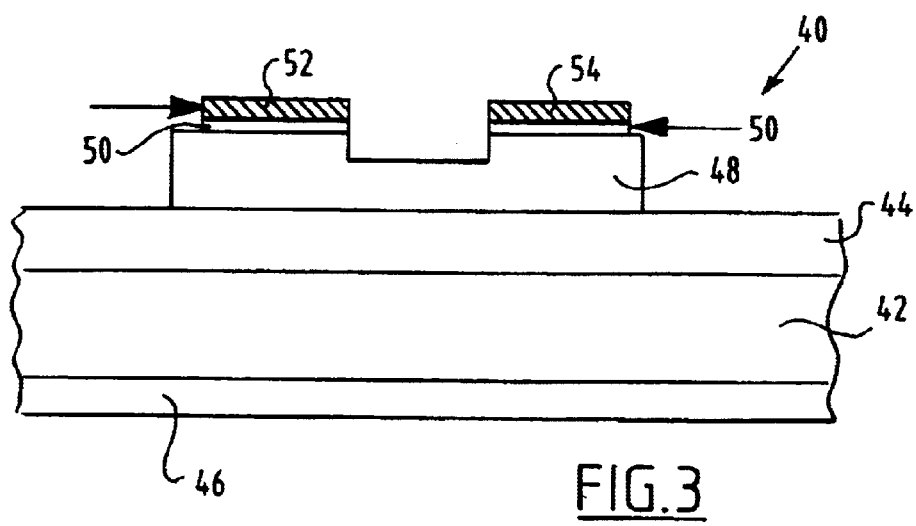
FIG. 3 shows a schematic cross-section of a thin film transistor.

Substrate Pretreatment and Semiconducting Film Deposition According to the Present Invention A deposition chamber 24 (FIG. 2) according to the present invention, comprises a gas inlet 25, two filament wires 30, a displaceable shutter element 28, a thermocouple 26, a heater 22 and a gas outlet 32 connected to a pump for pumping the gas out of the chamber.

A substrate, for example a thermally oxidized silicon wafer 20, can be arranged between the shutter and the heating element.

The thermally oxidized wafer 20 (oxide thickness is approximately 200 nanometer) is in the proximity of a heater 22 in a vacuum vessel 24. The heater 22 of the system is set to its process temperature, typically in the range of 100° C. to 600° C. and is connected to a thermocouple 26, A shutter 28 protecting the wafer 20 from contamination and from the heat of a tungsten filament 30 remains spatially inbetween the filament 30 and the wafer 20. When the wafer has reached its process temperature, the tungsten filament 30 is turned on by applying an AC or DC voltage to its terminals. Typically, an AC voltage of 10–220 Volt and a current in the range of 10 Ampere to 20 Ampere is used, depending on, e.g., the length of the said filament. The temperature of the filament then is in the range of 1600° C. to 2000° C. For at least 45 minutes the whole system remains in this condition to stabilize the wafer temperature and the temperature of all other mechanical components in the vessel. Subsequently, hydrogen gas, $H_2$, is admitted to the vacuum vessel 24, the shutter 20 is then removed from between the filament 30 and wafer 20, and the system remains in this situation for at least 1 minute, preferably 15 minutes. The $H_2$ is dissociated into hydrogen atoms. The shutter 20 is closed and the $H_2$ gas flow is turned off. Subsequently a silicon-carrying gas, preferably silane, or gas mixture is admitted to the vacuum vessel 24 through gas inlet 25. After re-opening the shutter 26, now through dissociation of the silicon-carrying gas along the hot filament the actual deposition takes place of the semiconducting material that forms the channel region of the TFT.

It was surprisingly found by the inventors that by periodically isolating the substrate by means of opening and closing the shutter, a TFT with a consistent gate voltage and a desired saturation mobility was obtained. An advantage of a good saturation mobility is that the electrons can transfer at a higher rate, to yield more responsive TFT's.

The range in which the main deposition parameters are set are typically the following wafer temperature between 200 and 600° C., silane gas flow between 20 standard cm$^3$/minute and 150 standard cm$^3$/minute, vessel pressure between 15 micro bar and 500 microbar, and the temperature of the tungsten filament between 1600° C. And 2000° C. Typically, it takes 2.5 minutes to form the α-Si:H layer.

Since the deposition temperature of the subsequent highly doped semiconducting layer is lower than that of the first semiconducting layer, the sample needs to cool down. The cooling of the sample is done with a continuous silane flow present through the vacuum vessel for about 15 minutes, with the filament turned off. The silane flow is used to prevent hydrogen atoms from desorbing form the growm α-Si:H film during the cooling.

After reaching the appropriate temperature, but prior to the deposition of the highly doped semiconducting layer, $H_2$ gas is admitted to the vessel 24 and a plasma is created for at least 1 minute, but preferably for 3 minutes. In order to make this possible, the vessel 24 is equipped with a radio frequency electrode 31 and radio frequency generator 33 in addition to the hot-filament assembly. The purpose of this plasma treatment is to passivate the surface dangling bonds and subsurface defects that remain in the deposited film after the silane gas treatment during cool down. The treatment with a $H_2$ plasma results in a good-quality, low resistance, electrical contact between the just deposited semiconducting layer and the subsequently highly doped semiconducting layer. After this treatment the sample is transported in vacuum to another vacuum vessel with method known to those skilled in the art. In this next vessel the highly doped semiconducting layer is formed with a conventional 13.56 MHz glow discharge (not shown).

EXPERIMENTAL

Example 1

Parameter settings:

filament temperature, 1750° C., pressure, 20 micro bar, substrate temperature, 430° C., gas flow, 90 standard cm³/minute.

The following procedure was followed:

Sample loaded in the process chamber 17:00 p.m.

Filaments turned on (shutter closed): 9:30 a.m. next day $H_2$ flow on, open shutter @ 10:15 a.m. or 15 minutes, close shutter $H_{2\ flow\ off,\ SiH4}$ flow on @ 10:30 a.m., open shutter $SiH_4$ flow on for 2 minutes and 30 seconds, close shutter Then filaments turned off Then 15 minutes continuous 40 sccm $SiH_4$ flow $SiH_4$ turned off, 20 sccm $H_2$ flow turned on Then rf turned on for 3 minutes ($H_2$ plasma)

Then chamber evacuated & sample transport to chamber for highly doped silicon deposition Then n⁺ deposition for 11 minutes and 40 seconds Then sample taken out and put in Aluminum evaporator With conventional techniques the aluminum source (S), and drain (D) contacts were made and through conventional etch procedures the n⁺ was removed from in between S & D.

The TFT obtained according to this experimental data yielded the current vs potential difference graph of FIG. 8.

Various data recorded during the growth of these TFT layers is shown in table 1 below.

TABLE 2

| | TFT | | | | |
|---|---|---|---|---|---|
| Run # P1251 | | | | Project: KNAW | |
| Date: 13-09-1996 | | | | Purpose: HW TFT | |
| Substrates: wafer no. 19 | | | | Cleaning: — | |
| Lamps [min]: 5 | | | | Operator: KW | |
| Layer type | l | | | n | |
| MPZ# | 4 | 4 | 4 | 4 | 3 |
| El distance [mm] | 30x40 | 30x40 | 30x40 | ~40 | 2 |
| Preheat | night + 45 min with wires on | | | Zero H55 | |
| Prepressure [Torr] | 6E-07 | | | 8E-09 | |
| Deposition time | 15' | 2'30" | 15' | 3' | 11'40" |
| Est. thickness [nm] | — | 250 | — | — | 50 |
| flow Silane | | 90 | 40 | | 40 |
| flow Hydrogen | 20 | | | 20 | |
| flow Methane | | | | | |
| flow TMB | | | | | |
| flow Phosphine | | | | | 11 |
| flow | | | | | |
| Pressure [microbar] | 20 | 20 | — | 700 | 400 |
| Temperature (° C.) | 450 | 450 | 450 > 440 | 440 | 230 HT |
| Generator used | | | | RFA | RFA |
| Power [W] | | | | 3 | 3 |
| Refl. power [W] | | | | 0.2 | 0.3 |
| Pot. position | | | | 1.00 | 1.01 |
| Frequency [MHz] | | | | 13.56 | 13.56 |
| Load | | | | 49 | 47 |
| Tune | | | | 12 | 12 |
| DC bias [V] | | | | −16 | −11 |
| Voltage [V] | 16.5 | | | | |
| Current [A] | 14 | 14 | 0 | | |

The mobility in the TFT saturation regime was determined by measuring the source-drain current $I_s$ while, at all items during the measurement, the source-drain voltage $V_s$ was kept equal to the gate voltage $V_g$ ($V_s=V_s$). Then $I_s$ was approximated by $$I_s = \frac{W}{2L}\mu_s C_i(V_g - V_t)^2$$

with W the channel width, L the channel length, $\mu_s$ the saturation mobility, $C_i$ the gate insulator capacitance, and $V_t$ the threshold voltage. The square-root of $I_s$ was then plotted versus $V_g$. From the slope of a linear fit to the straight part of this curve it was calculated, before gate bias stress, that $\mu_s=0.75\pm0.05$ cm²/V·s whereas the abscissa was equal to $V_t=7.8\pm0.3$ V. After +25V gate bias stress for 2.5 h the threshold voltage remained unchanged. The high value of $\mu_s$ indicated the high quality of this transistor.

Conventional state-of-the-art PECVD α-Si:H TFTs typically have $\mu_s=0.4\pm0.8$ cm³/V·s and a comparable $V_t$ when $SiO_2$ is used as the gate dielectric. After similar gate bias stress conventional TFTs typically show a threshold voltage shift of +2 V or larger.

Polycrystalline silicon TFTs

Using the same preparation method of the substrate, hydrogenated Polycrystalline silicon, poly-si:H layers were made, by simply changing the deposition parameters. Multi-layer structures were also made in which the initial phase of the growth on the $SiO_2$ substrate was amorphous, which was then followed by formation of crystals with a preferred orientation perpendicular to the substrate's surface according to the present invention. Examples 2 and 3, below illustrate these.

Example 2

The following parameters were used to obtain poly-Si:H TFTs, with in amorphous incubation layer at the interface with the $SiO_2$;

$T_{wire}=1900°$ C., $T_{set}=648°$ C. (resulting in a pre-deposition substrate temperature of 430° C.), $\phi SiH_4=10$ sccm, $\phi H_2=150$ sccm, p=100 micro bar.

For these TFTs a saturation mobility $\mu_s$ of $1.10\pm0.03$ cm²/V·s was calculated and a threshold voltage $V_t$ of $6.6\pm0.3$ V. Within the experimental error, no threshold voltage shift was observed after 65 h of gate bias stress.

Example 3

The following parameters were used to obtain purely intrinsic poly-Si:H without an amorphous incubation layer:

$T_y=1830°$ C., $T_{set}=648°$ C. (resulting in a pre-deposition substrate temperature of 430° C.), $\phi SiH_4=0.8$ sccm, $\phi H_2=150$ sccm, p=100 micro bar.

In TFTs which incorporate this material a saturation mobility $\mu_s$ between 2 and 100 cm²/V·s can be obtained. Since the channel region ham no amorphous nature, outer gate bias stress a threshold voltage shift in not to be expected.

What is claimed is:

1. An electronic device having a substantially consistent gate voltage and a saturation mobility $\mu$, in the range of about 0.001 to about 100 cm²/V·s.

2. A device comprising a substantially exclusive polycrystalline Si:H or a polycrystalline and amorphous Si:H layer, said device having a substantially consistent gate voltage and a saturation mobility lying in the range of about 0.001 to about 500 cm²/V·s.

3. The electronic device of claim 1 which has a saturation mobility in the range of about 0.001 to about 10 cm$^2$/V·s.

4. The electronic device of claim 1 which has a saturation mobility in the range of between about 0.1 to about 1.00 cm$^2$/V·s.

5. The electronic device of claim 1 which is a transistor.

6. The device comprising a substantially exclusive polycrystalline Si:H or a polycrystalline and amorphous Si:H layer of claim 2 wherein said device has a saturation mobility lying in the range of about 0.001 to about 500 cm$^2$/V·s.

7. A device obtainable according to a process for providing a semiconducting device comprising the steps of depositing a semiconducting layer onto a substrate situated in a vessel by means of heating gas to a predetermined, dissociation temperature so that the gas dissociates into fractions, whereby those fractions subsequently condense on the substrate to build up a semiconducting layer, wherein the substrate is periodically protected from the heating element and/or the gas, present in the vessel, by means of a displaceable isolating shutter, and wherein said resultant device has a substantially consistent gate voltage and has a saturation mobility in the range of about 0.001 to about 100 cm$^2$/V·s.

8. A device obtainable according to the process of claim 7 wherein said device has a saturation mobility in the range of about 0.001 to about 10 cm$^2$/V·s.

9. A device obtainable according to the process of claim 7 wherein said device has a saturation mobility in the range of about 0.1 to about 1.0 cm$^2$/V·s.

* * * * *